(12) United States Patent
Chiu et al.

(10) Patent No.: US 10,607,955 B2
(45) Date of Patent: Mar. 31, 2020

(54) HETEROGENEOUS FAN-OUT STRUCTURES FOR MEMORY DEVICES

(71) Applicant: SanDisk Semiconductor (Shanghai) Co. Ltd., Shanghai (CN)

(72) Inventors: Chin-Tien Chiu, Taichung (TW); Chih-Chin Liao, Yuanlin Town (TW); Weiting Jiang, Shanghai (CN); Hem Takiar, Fremont, CA (US)

(73) Assignee: SanDisk Semiconductor (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 15/636,078

(22) Filed: Jun. 28, 2017

(65) Prior Publication Data
US 2018/0366429 A1 Dec. 20, 2018

(30) Foreign Application Priority Data
Jun. 20, 2017 (CN) .......................... 2017 1 0468484

(51) Int. Cl.
*H01L 25/065* (2006.01)
*H01L 23/00* (2006.01)
(Continued)

(52) U.S. Cl.
CPC .......... *H01L 24/08* (2013.01); *H01L 23/5389* (2013.01); *H01L 24/16* (2013.01);
(Continued)

(58) Field of Classification Search
CPC ..... H01L 25/50; H01L 24/19; H01L 2224/97; H01L 23/3114; H01L 24/17;
(Continued)

(56) References Cited

U.S. PATENT DOCUMENTS 9,012,269 B2    4/2015    Jin et al.
9,224,647 B2    12/2015    Koo et al.
(Continued)

FOREIGN PATENT DOCUMENTS

| CN | 102959700 A | 3/2013 |
|----|-------------|--------|
| CN | 104617084 A | 5/2015 |
| EP | 2 207 200 A1 | 7/2010 |

OTHER PUBLICATIONS

Huemoeller, Ron et al., "Silicon wafer integrated fan-out technology," ChipScaleReview.com; Mar. 2015; 3 pages.

*Primary Examiner* — Marcos D. Pizarro
*Assistant Examiner* — Quinton A Brasfield
(74) *Attorney, Agent, or Firm* — Brinks Gilson & Lione

(57) ABSTRACT

A device may include a fan-out structure that has a plurality of integrated circuits. The integrated circuits may be of different types, such as by being configured differently or configured to perform different functions. The fan-out structure may be coupled to another integrated circuit structure, such as a die stack. For example, the fan-out structure may be coupled to a top surface or a bottom surface of the integrated circuit structure, or may otherwise be disposed within a vertical profile defined by the integrated circuit structure. Horizontally-extending and vertically-extending paths may be disposed in between and around the combined fan-out structure and integrated circuit structure to enable the integrated circuits of the two structures to communicate.

10 Claims, 11 Drawing Sheets

(51) Int. Cl.
  *H01L 25/00* (2006.01)
  *H01L 23/538* (2006.01)
  *H01L 25/18* (2006.01)
  *G11C 5/04* (2006.01)

(52) U.S. Cl.
  CPC ............ *H01L 24/32* (2013.01); *H01L 25/065* (2013.01); *H01L 25/0652* (2013.01); *H01L 25/0657* (2013.01); *H01L 25/18* (2013.01); *H01L 25/50* (2013.01); *G11C 5/04* (2013.01); *H01L 2224/02379* (2013.01); *H01L 2224/12105* (2013.01); *H01L 2224/16221* (2013.01); *H01L 2224/2518* (2013.01); *H01L 2224/32145* (2013.01); *H01L 2224/73267* (2013.01); *H01L 2225/06527* (2013.01); *H01L 2225/06548* (2013.01); *H01L 2225/06551* (2013.01); *H01L 2924/1434* (2013.01); *H01L 2924/181* (2013.01)

(58) Field of Classification Search
  CPC . H01L 2224/02379; H01L 2224/04105; H01L 23/5389
  See application file for complete search history.

(56) References Cited

U.S. PATENT DOCUMENTS

| | | | |
|---|---|---|---|
| 9,224,717 B2 | 12/2015 | Sato et al. | |
| 9,293,437 B2 | 3/2016 | Yu et al. | |
| 9,401,331 B2 | 7/2016 | Lin et al. | |
| 2010/0270668 A1 | 10/2010 | Marcoux | |
| 2012/0317332 A1* | 12/2012 | Kwak | G06F 12/0246 711/102 |
| 2013/0148401 A1* | 6/2013 | Fai | H01L 25/0657 257/E21.705 |
| 2015/0048500 A1* | 2/2015 | Yu | H01L 25/50 257/737 |
| 2015/0303174 A1* | 10/2015 | Yu | H01L 25/0657 257/712 |
| 2016/0118326 A1 | 4/2016 | Kwon | |
| 2016/0260695 A1* | 9/2016 | Chung | H01L 23/5386 |
| 2016/0322330 A1* | 11/2016 | Lin | H01L 25/0652 |
| 2017/0012031 A1* | 1/2017 | Lim | H01L 25/18 |
| 2017/0110413 A1* | 4/2017 | Chen | H01L 21/3205 |

\* cited by examiner

HETEROGENEOUS FAN-OUT STRUCTURES FOR MEMORY DEVICES

CROSS-REFERENCE TO RELATED APPLICATIONS

This application claims priority to Chinese Patent Application No. 201710468484.6, filed Jun. 20, 2017. The contents of Chinese Patent Application No. 201710468484.6 are incorporated by reference in their entirety.

BACKGROUND

A non-volatile memory system may be implemented as a plurality of dies. At least one of the dies may be configured as a memory die, which includes memory cells that store data in the memory system. Another of the dies may be configured to function as a controller that controls or otherwise manages the storage of the data in the memory system. Other types of dies may be possible, such as those that deliver power, perform routing or switching operations to communicate signals between the controller die and the memory dies, or those that include volatile memory for temporary storage of data or other information. The dies in the memory system other than the memory dies may be collectively referred to as accessory or auxiliary dies.

Design specifications for next-generation memory systems continually require an increase in storage capacity, and more memory dies may be needed in order to meet these requirements. As more memory dies are needed, more accessory dies may also be needed.

One way a plurality of memory dies can be integrated together is by orienting them in a planar fashion, such as by mounting each of them on a respective portion of a surface of a substrate. Integrating memory dies in this manner continually increases the surface area as more and more dies are added to the memory system. Another way a plurality of memory dies can be integrated together is by stacking the memory dies on top of one another. Stacking the memory dies instead of mounting them adjacent to each other on a substrate surface may reduce or minimize the increase in surface area as more memory dies are added to the memory system.

In addition, one way memory dies may be electrically connected to accessory dies is through wire bonding. A signal path formed via wire bonding may couple die capacitance of a plurality of memory dies in parallel. As a result, increasing the number of memory dies may increase an overall capacitance of the signal path, which in turn may limit the number of memory dies that can be included in the system.

Also, the memory dies and the accessory dies may be packaged together in various ways. In some example configurations, a memory die stack may be mounted on one portion of a surface of a substrate, one or more accessory dies may be mounted on another portion of the substrate surface and wire bonded to the memory die stack, and the memory die stack and the accessory dies may be encapsulated together. The substrate carrying the memory die stack and the accessory dies may, in turn, be mounted on a second or main substrate, which may also have mounted to it other substrates carrying other memory die stacks and/or additional accessory dies, such as a controller die and a volatile memory die. The components mounted on the second substrate may be encapsulated together via a second encapsulation process. Although such a configuration is able to contain all of the components of a non-volatile memory system, it may have undesirably large dimensions (length, height, and width) due to having multiple components separately mounted to different portions of a surface of a main substrate. Also, since wire bonding may be used, the number of memory dies that may be included in a single stack may be limited. If such a number is less than the total number of memory dies needed to meet the storage capacity requirements, multiple separately-encapsulated memory die stacks may be included, which is another factor that contributes to the relatively large dimensions of the memory system.

To reduce the overall size of the memory system while increasing its storage capacity, a design or configuration that increases the number of memory dies within a single encapsulated stack, decreases the number of substrates needed to carry the memory dies, and minimizes the number of components mounted on the main substrate may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Overview

Figure 1:
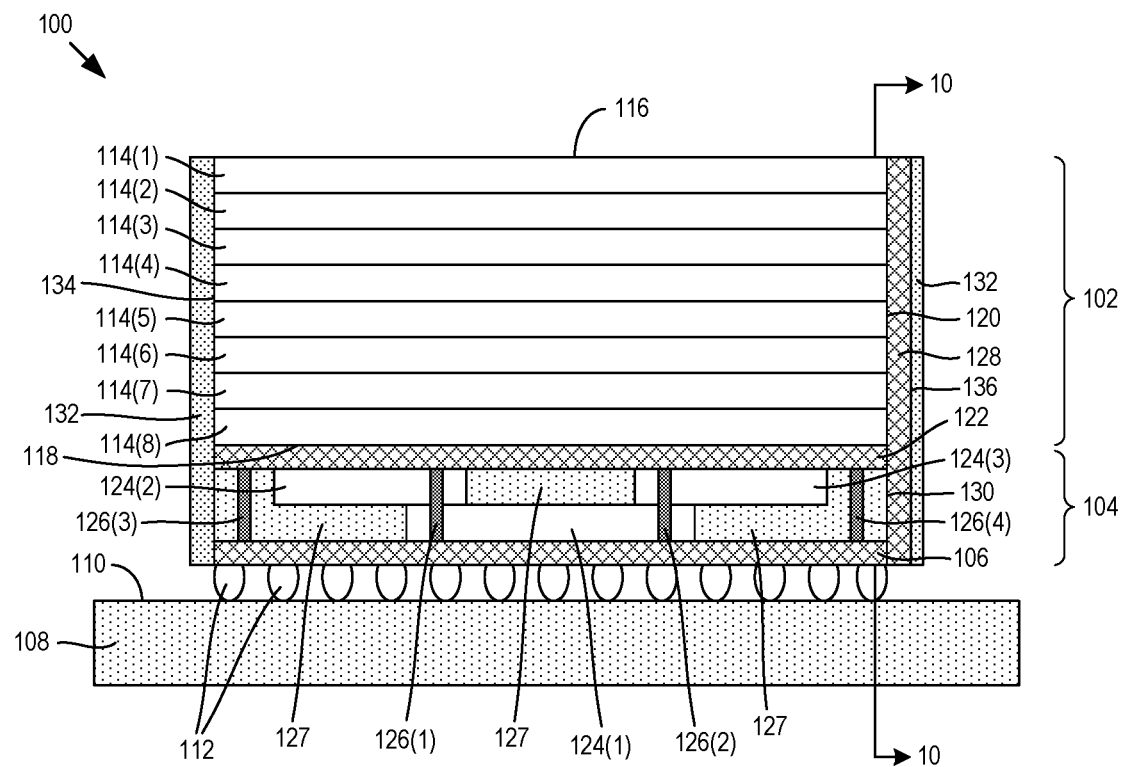
FIG. 1 is a cross-sectional side view of an example multi-die stack structure.

The following embodiments describe a heterogeneous fan-out structure integrated with a multi-die stack. In a first embodiment, a device includes: a die stack, and a fan-out structure disposed in a volume defined by a vertical profile of the die stack.

In some embodiments, the fan-out structure includes a first die and a second die of different types.

In some embodiments, the fan-out structure includes a first redistribution layer and a second redistribution layer, where the first die and the second die are disposed in between the first redistribution layer and the second redistribution layer.

In some embodiments, a vertical interconnect portion extends over a side surface of the die stack and the fan-out structure, where the first die and the second die are configured to communicate with the die stack via the vertical interconnect portion and the first redistribution layer and the second redistribution layer.

In some embodiments, a planar surface area of a die of the fan-out structure is smaller than a planar surface area of dies of the die stack.

In some embodiments, the die stack includes a plurality of memory dies.

In some embodiments, the fan-out structure includes a first die and a second die, where the first die is configured as a controller for the plurality of memory dies and the second die is configured as a routing die configured to route signals in between the controller and the memory dies.

In some embodiments, no substrate is disposed in between the die stack and the fan-out structure.

In some embodiments, the die stack and the fan-out structure are encapsulated in a single package.

In another embodiment, a device includes: a first die; a second die oriented parallel with the first die; a horizontal signal path disposed in between and extending parallel with the first die and the second die; and a vertical signal path extending perpendicular to the parallel orientation of the first and second dies. The first die is configured to communicate with the second die via the horizontal signal path and the vertical signal path.

In some embodiments, a third die is oriented parallel with the first die and the second die, and the second die is disposed in between the first die and the second die.

In some embodiments, the first die includes an array of memory cells. The second die and the third die are accessory dies to control the storage of data in the array of memory cells.

In some embodiments, the second die is disposed in between a first horizontal signal path and a second horizontal signal path.

In some embodiments, the first horizontal signal path and the second horizontal signal path are each configured as a redistribution layer.

In some embodiments, no substrate is disposed in between the first die and the second die.

In some embodiments, the first die, the second die, the horizontal signal path and the vertical signal path are encapsulated within a single package.

In another embodiment, a device includes: a first redistribution layer; a second redistribution layer; and a first integrated circuit and a second integrated circuit disposed in between the first redistribution layer and the second redistribution layer. An active surface of the first integrated circuit is in contact with the first redistribution layer. In addition, the first integrated circuit and the second integrated circuit are of different types.

In some embodiments, the first integrated circuit is configured to receive host read and write commands from an external host device, and the second integrated circuit is configured to perform routing operations to communicate data in between the first integrated circuit and a plurality of memory dies.

In some embodiments, the plurality of memory dies is configured as a die stack.

In some embodiments, the first redistribution layer is in contact with a planar surface of a die stack.

Other embodiments are possible, and each of the embodiments can be used alone or together in combination. Accordingly, various embodiments will now be described with reference to the attached drawings.

Embodiments

FIG. 1 shows a cross-sectional side view of an example multi-die stack structure (or a three-dimensional integrated circuit structure) 100 that includes a die stack portion 102 and a fan-out portion 104. The multi-die stack structure 100 may be configured as a single package. In addition, the multi-die stack structure 100 may not include a substrate on which its integrated circuit (IC) components (e.g., dies) are mounted, and the IC components may communicate with each other across signals paths that do extend across such a substrate. Also, the signals paths within the multi-die stack structure may include a plurality of vertically-extending and horizontally-extending conductive elements, and may not include wire bonds. In addition, the IC components of the multi-die stack structure may be configured to communicate external to the multi-die stack structure 100 via a base redistribution layer (RDL) 106, which may provide a communication interface for the multi-die stack structure 100 and external circuitry that is external to the multi-die stack structure 100. For example, as shown in FIG. 1, the multi-die stack structure 100 may be mounted on a substrate 108, and the base RDL 106 may be mechanically and electrically connected to signal paths or traces (not shown) of the substrate 108 via solder bumps (or balls) 112 or other similar types of conductive interconnects. From a structural perspective, each of the IC components of the multi-die structure 100 may be disposed above the base RDL 106. Otherwise stated, no IC component may be closer to the planar surface 110 of the substrate 108 than the base RDL 106, or the base RDL may be disposed in between the planar surface 110 and each of the IC circuits of the multi-die stack structure 100.

As used herein, a substrate, such as the substrate 108, is a planar structure that serves as a foundation layer or support structure on an integrated circuit package, such as the multi-die stack structure 100, is mounted. A substrate may include one or more metal layers horizontally extending on or within a solid, insulating core material and/or conductive vias vertically extending through the core material. To form the metal layers and/or conductive vias, the substrate may be subjected to any of various processes, such as drilling, copper plating, copper etching, stripping, masking, and metal finishing. Integrated circuits or integrated circuit packages, such as the multi-die stack structure 100, may be mounted on the substrate, and may be electrically connected to the integrated circuit(s) or integrated circuit package(s) through electrical interconnects, such as wire bonds, solder balls or bumps, and/or redistribution layers, as non-limiting examples.

In further detail, the die stack portion 102 may include a plurality of dies 114 (alternatively referred to as integrated circuits (IC) or IC chips). For simplicity, FIG. 1 shows the die stack portion 102 as including eight dies 114—including a first die 114(1), a second die 114(2), a third die 114(3), a fourth die 114(4), a fifth die 114(5), a sixth die 114(6), a seventh die 114(7), and an eighth die 114(8)—although numbers of dies other than eight may be included in the die stack portion 102. Indeed, the present description contemplates numbers of dies larger than eight, including numbers such as sixteen, thirty-two, sixty-four, or higher. As described in further detail below, the dies 114 of the die stack 102 may be configured to communicate with the dies of the fan-out portion 104 without the use of wire bonds or other similar types of wire structures coupling in parallel the capacitance of the dies 114, which may allow power and signals to be successfully communicated (e.g., by meeting power, voltage swing, and noise specification requirements) to a larger number of dies 114 in the die stack 102 (e.g., numbers greater than 16, such as on the order of 32 dies, 64 dies, or higher).

Figure 2:
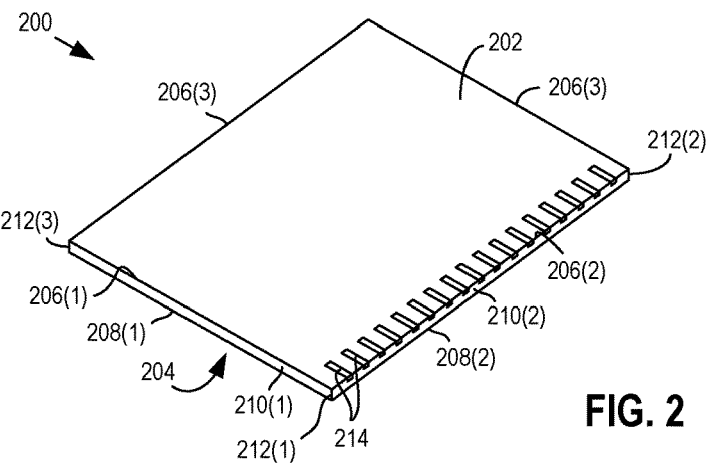
FIG. 2 is a perspective view of an example die that may be representative of a die of the multi-die stack structure of FIG. 1.

FIG. 2 shows a perspective view of an example die 200, which may be representative of any of the dies 114 of the die stack portion 102. As shown in FIG. 2, the die 200 may be a generally planar structure that has a first planar surface 202 and an opposing, second planar surface 204. The first and second planar surfaces 202, 204 may be opposing in that they face in opposite directions. In some example configurations, one of the first and second planar surfaces 202, 204 may be considered or referred to as a top planar surface and the other of the first and second planar surfaces 202, 204 may be considered or referred to as a bottom planar surface. However, while the terms "top" and "bottom" as well as other terms such as "above" and "below" are used to describe the relative position of the components of the multi-die stack structure 100, they should not be construed as limiting the relative positioning of the components since the multi-die stack structure 100 can be oriented in any of various positions.

In addition, as a planar structure, the die 200 may include a first plurality of horizontal edges 206—including a first edge 206(1), a second edge 206(2), a third edge 206(3), and a fourth edge 206(4)—that define a perimeter or boundary of the first planar surface 202. The die 200 may also include a second plurality of horizontal edges 208 defining a perimeter or boundary of the second planar surface 204. Only the first and second edges 208(1), 208(2) are shown in FIG. 2. Also, as the die 200 is a three-dimensional structure with some amount of height between the first and second planar surfaces 202, 204, the die 200 may include a plurality of side surfaces 210 in between and extending substantially perpendicular to the first and second planar surfaces 202, 204. Only a first side surface 210(1) and a second side surface 210(2) are shown in FIG. 2. Vertical edges 212 may form where two adjacent side surfaces 210 meet. For example, a first vertical edge 212(1) forms where the first side surface 210(1) and the second side surface 210(2) meet. A second vertical edge 212(2) and a third vertical edge 212(3) are also visible in the perspective view of FIG. 2. As used herein, the term "horizontal" may refer to a direction or dimension extending parallel or substantially parallel to the first and second planar surface 202, 204 (or in general to the planar orientation of the die 200). The term "vertical" may refer to a direction or dimension extending perpendicular or substantially perpendicular to the first and second planar surfaces 202, 204 (or in general to the planar orientation of the die 200). So, for example, the length and width of the die 200 defining the surface area of the first and second planar surfaces 202, 204 may be considered horizontal dimensions, and the height (or thickness) of the die 200 may be considered a vertical dimension. Also, the first and second surfaces 202, 204 may be considered to be and/or referred to as facing in vertical directions, and the side surfaces 210 may be considered to be and/or referred to as facing in horizontal directions.

The die 200 may include various active and/or passive circuit elements such as transistors, resistors, capacitors, and interconnecting conductive signal paths or signal path portions, as non-limiting examples. The signal paths may extend horizontally and/or vertically be used to interconnect the other circuit elements, such as the transistors, resistors, and capacitors, and may include conductive traces, lines, leads, and vias as non-limiting examples. The conductive signal paths are generally metal, though they may be alternatively formed of other electrically conductive material, such as highly doped semiconductor. The circuit elements may be formed within a region or in one or more layers near one of the planar surfaces 202, 204 of the die 200. The planar surface where or nearest to where the circuit elements are formed may be referred to as the active surface of the die 200, and the other planar surface may be referred to as the non-active surface of the die 200.

Referring to FIGS. 1 and 2, for some example configurations, the multi-die stack structure 100 may be or may be a component of a memory device, such as a semiconductor memory device, in which the circuit elements of the dies 114 of the die stack portion 102 include memory elements or cells configured to store data. For such configurations, the dies 114 may be referred to as memory dies. As a semiconductor memory device, the multi-die stack structure 100 may be a volatile memory device or may be a component of a volatile memory device, such as a dynamic random access memory ("DRAM") or a static random access memory ("SRAM") device, a non-volatile memory device, such as resistive random access memory ("ReRAM"), electrically erasable programmable read only memory ("EEPROM"), flash memory (which can also be considered a subset of EEPROM), ferroelectric random access memory ("FRAM"), or magnetoresistive random access memory ("MRAM"), or other semiconductor elements, including a combination of volatile and non-volatile memory, capable of storing information. Each type of memory device may have different configurations. For example, flash memory devices may be configured in a NAND or a NOR configuration.

The memory elements can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located in the die 200 may be arranged in two or three dimensions, such as a two dimensional memory structure or a three dimensional memory structure.

In a two dimensional memory structure, the semiconductor memory elements of the die 200 are arranged in a single plane or a single memory device level. Typically, in a two dimensional memory structure, memory elements are arranged in a plane that extends substantially parallel to the first and second planar surface 202, 204. The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array of the die 200 is arranged so that memory elements occupy multiple planes or multiple memory device levels, thereby forming a structure in three dimensions (i.e., in the x, y and z directions, where the y direction is substantially perpendicular and the x and z directions are substantially parallel to first and second planar surfaces 202, 204). As a non-limiting example, a three dimensional memory array may be arranged as multiple vertical columns (e.g., columns extending substantially perpendicular to the first and second planar surfaces 202, 204 (i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

With reference to FIG. 1, the plurality of dies 114 configured as a stack may be a three-dimensional memory structure, where each of the dies 114 may include a two-dimensional memory array or a three-dimensional memory array.

Referring particularly to FIG. 2, the die 200 may include a plurality of conductive input/output (I/O) terminals 214, alternatively referred to as I/O pads, contacts, contact terminals, or leads. The I/O terminals 214 may be part of the conductive signal paths and/or electrically coupled to the conductive signal paths of the die 200. In addition, the I/O terminals 214 may be configured to communicate signals, and/or power, and/or function as a ground reference between the circuit elements of the die 200 and other dies of the die stack portion 102, IC components of the fan-out portion 104, or other components of the multi-die stack structure 100. For example configurations where the dies 114 are memory dies, the signals that may be communicated through the I/O terminals 214 may include data signals carrying data to be programmed into the memory cells of the die 200 or read from the die 200, command and response signals to control memory operations performed on the die 200, or clock or strobe signals to control timing of the memory operations. Other types of signals may be possible. Also, as mentioned, one more of the I/O terminals 214 may be configured to receive power, such as a supply voltage, and/or be connected to a ground reference.

For some example configurations, the I/O terminals 214 may be configured on or at the active surface of the die 200. In this regard, the first planar surface 202 may be the active surface of the die 200. However, in other example configurations, the I/O terminals 214 may be configured on or at the non-active surface of the die 200. For simplicity, FIG. 2 shows the I/O terminals 214 but not other circuit elements of the die 200. Also, as shown in FIG. 2, each of the I/O terminals 214 may be aligned relative to each other by being positioned at or near and/or extending toward the same horizontal edge and adjacent side surface, which in the configuration shown in FIG. 2 is the second side edge 206(2) and the second side surface 210(2).

Figure 3:
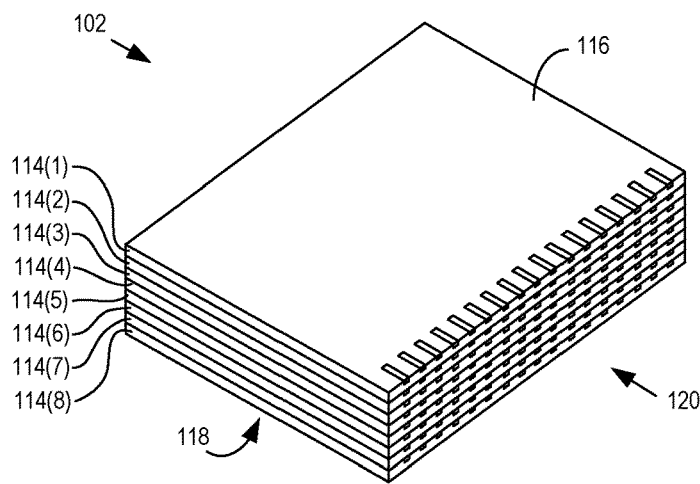
FIG. 3 is a perspective view of a die stack portion of the multi-die stack structure of FIG. 1.

FIG. 3 shows a perspective view of the dies 114 of the die stack portion 102 in isolation. The dies 114 in FIG. 3 are shown as having the configuration of the example die 200 of FIG. 2. As shown in FIG. 3, the dies 114 may be stacked on top of one another such the dies 114 are oriented parallel or substantially parallel with each other. In addition, the positioning of the dies 114 over one another may be aligned in a manner such that the stacked dies 114 form a generally cuboid structure. The die that is furthest away from the base RDL 106 (FIG. 1), which is the first die 114(1) in FIGS. 1 and 3, may be considered the top die of the stack 102, and the planar surface 116 of the first die 114(1) that faces away from the base RDL 106 may be referred to as the top surface of the stack 102 of dies 114. The die that is closest to the base RDL 106 (FIG. 1), which is the last or eighth die 114(8) in FIGS. 1 and 3, may be referred to as the bottom die of the stack 102, and the planar surface 118 that faces toward the base RDL 106 may be referred to as the bottom surface of the stack 102 of dies 114.

Also, the dies 114 may be aligned relative to each other such that vertically adjacent side surfaces of the dies 114 may be flush or substantially flush with one another to form substantially flat side surfaces of the cuboid structure. Also, as shown in FIG. 3, the dies 114 may be aligned relative to each other such that the I/O terminals (i.e., those corresponding the I/O terminals 214 of FIG. 2) are in vertical alignment with each other such that the respective sides surfaces of the dies 114 near which the I/O terminals are positioned and/or to which the I/O terminals extend form the same side surface 120 of the cuboid stack 102. As described in further detail below, the side surface 120 may be adjacent and/or affixed to a network of vertical interconnects or traces that electrically connect to the I/O terminals. These vertical interconnects may communicate the signals, power, and ground between the I/O terminals and IC circuit components of the fan-out portion 104.

Figure 4:
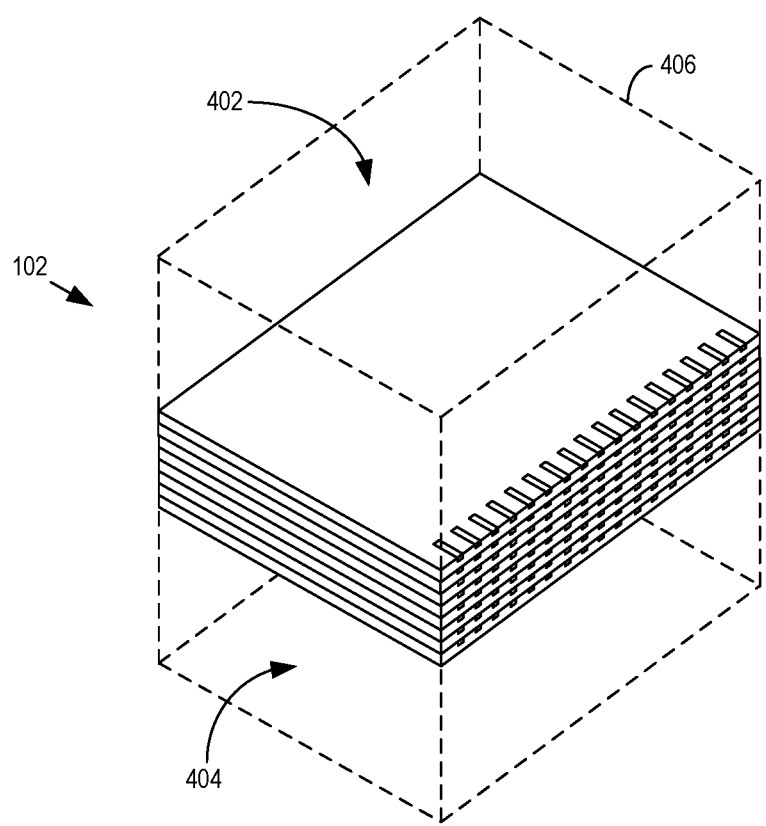
FIG. 4 is a perspective view of the die stack portion of FIG. 3, further identifying volumes defined by a vertical profile of the die stack portion.

FIG. 4 shows the die stack portion 102 as shown in FIG. 3, and further shows volumes 402, 404 respectively above and below the die stack 102 that are defined by a vertical profile of the die stack 102, as indicated by dotted lines 406. As previously described, the vertical directions relative to the die stack 102 may be the directions perpendicular to the planar orientation of the dies 114 and/or the directions in which the planar surfaces of the dies 114 face. The vertical profile, and in turn the volumes 402, 404 above and below the die stack 402, may be horizontally determined and bounded by the horizontal edges and/or the planar surface area of the dies 114.

Referring also to FIG. 1, the fan-out portion 104 may be disposed within one of the volumes 402, 404 defined by the vertical profile of the die stack 102. In the example configuration shown in FIG. 1, the fan-out portion 104 is disposed in the volume 404 below and/or closest to the bottom die 114(8). The fan-out portion 104 may be vertically bounded by the distance between the base RDL (also referred to as a first RDL) 106 and a second redistribution layer (RDL) 122. In addition or alternatively, the vertical dimension or height of the fan-out portion 104 may be determined by the distance between the base RDL (also referred to as a first RDL) 106 and a second redistribution layer (RDL) 122. The fan-out portion 104 may further include a plurality of dies 124 (alternatively referred to as integrated circuits (IC) or IC chips) disposed in between the first RDL 106 and the second RDL 122. For clarity, the dies 124 that are part of the fan-out portion 104 may be referred to as fan-out dies. As described in further detail below, the fan-out dies 124 may be configured in various ways and include any of various numbers of dies. The example configuration shown in FIG. 1 includes three fan-out dies, including a first fan-out die 124(1), a second fan-out die 124(2), and a third fan-out die 124(3), in a partially-stacked arrangement.

Similar to the dies 114, the fan-out dies 124 may each be generally planar structures having opposing planar surfaces. The fan-out dies 124 may be configured within the fan-out portion 104 such that an active surface of at least one of the dies is in contact with and electrically connected to at least one of the first RDL 106 or the second RDL 122. As used herein, two surfaces being "in contact with" each other may refer to the two surfaces facing each other and being in direct contact, indirect contact, or a combination thereof. Direct contact may refer to the two surfaces physically touching each other. Indirect contact may refer to the two surfaces being separated by a material to adhere and/or enhance the conductive connection between the two surfaces. For example, a top planar surface and a bottom planar surface of two adjacent dies 114 of the die stack 102 may be indirectly in contact with each other due to an adhesive material, such as an epoxy, disposed in between the top and bottom surfaces. This is shown below with respect to FIGS. 10A-10J. In the configuration shown in FIG. 1, an active surface of the first fan-out die 124(1) may be in contact with and electrically coupled to the first RDL 106 and active surfaces of each of the second and third fan-out dies 124(2), 124(3) may be in contact with the second RDL 122.

Each of the first RDL 106 and the second RDL 122 may include one or more layers of one or more horizontally-extending metal traces that form conductive paths or portions of conductive paths. As used herein, a signal path and a conductive path are interchangeably used to generally to refer to a conductive path that extends between two connection points and that is configured to communicate a signal, power, or function as a ground reference. For example configurations where the first RDL 106 or the second RDL 122 includes multiple layers of metal traces, vertical conductive interconnects, such as vias (e.g., through-silicon vias (TSV)) may be included to electrically connect and form a signal path between two metal traces in two different layers. Accordingly, signal paths formed from the metal traces and/or vertical interconnects in the each of first RDL 106 and the second RDL 122 may extend horizontally, vertically, or a combination thereof. In general, a redistribution layer (RDL), such as the first RDL 106 and/or the second RDL 122, may be formed on a surface, such as an active surface, of an integrated circuit. The RDL may form one or more conductive paths or signal paths between one or more I/O connections points, such as contact pads, located on the integrated circuit on which the RDL is formed, other connection points, such as a solder balls/bumps. In this context, an RDL redistributes an I/O connection point of an integrated circuit to another location. In some example manufacturing processes, photolithography is be used to form the RDL layer. In addition, certain insulating material, such as polymers may be used as the material surrounding the conductive paths of the RDL layer.

A fan-out die 124 with its active layer in contact with a redistribution layer may be configured to communicate signals directly with the redistribution layer. For example, the active surface of the first fan-out die 124(1) may be in contact with the first RDL 106, and so connection points or I/O terminals on the active surface of the first fan-out die 124(1) may be connected to and communicate signals, power, or ground, with signal paths of the first RDL 106. Similarly, the active surfaces of the second fan-out die 124(2) and the third fan-out die 124(3) may each be in contact with the second RDL 122, and so connection points or I/O terminals on the active surface of the second fan-out die 124(2) may be connected to and communicate signals, power, or ground with signal paths of the second RDL 122, and connection points on the active surface of the third fan-out die 124(3) may be connected to and communicate signals with other signal paths of the second RDL 122.

In addition, the fan-out portion 104 may include one or more vertical interconnects 126 vertically extending in between the first RDL 106 and the second RDL 122. One or more of the vertical interconnects may extend at least partially through two or more fan-out dies 124. To illustrate as an example, FIG. 1 shows a first vertical interconnect 126(1) vertically extending through the first fan-out die 124(1) and the second fan-out die 124(2) and a second vertical interconnect 126(2) vertically extending through the first fan-out die 124(1) and the third fan-out die 124(3). A vertical connection that vertically extends at least partially through at least two or more fan-out dies may extend from and connect a connection point of one of the two or more fan-out dies to a connection point of another of the two or more fan-out dies; may extend from and connect a connection point of one of the first and second RDLs 106, 122 to a connection point of the other of the first and second RDLs 106, 122; or may extend from and connect a connection point of one of the two or more dies to a connection point of the first RDL 106 or the second RDL 122. In addition or alternatively, one or more of the vertical interconnects, such as a third vertical interconnect 126(3) and a fourth vertical interconnect 126(4) shown in FIG. 1, which may be in the form of conductive pillars or posts, may vertically extend from a connection point of the first RDL 106 to a connection point of the second RDL 122 without extending through any of the fan-out dies 124. In other words, the vertical interconnects 126(3), 126(4) may vertically extend around or outside of the fan-out sides 124. Also, as described in further detail below, the fan-out dies 124 and the vertical interconnects 126 may be encapsulated with an encapsulation material 127, such as an epoxy or epoxy-based material (e.g., an epoxy molding compound (EMC)) or other suitable material to secure, seal, and protect the fan-out dies 124 and the vertical interconnects 126 in the region between the first and second RDL 106, 122.

The multi-die stack structure 100 may further include a vertical interconnect portion 128 that includes a plurality of vertically-extending conductive members that form signal paths connected to the I/O terminals of the dies 114. The side surface 120 of the die stack 102 to which the I/O terminals extend and a side surface 130 of the fan-out portion 104 may be flush relative to each other and form a flat or substantially flat surface. The vertical interconnect portion 128 may be affixed to and/or formed over the combination of the side surfaces 120, 130. Through vertical signal paths or traces of the vertical interconnection portion 128, the dies 114 may be configured to communicate signals, power, and/or ground between each other and also with the fan-out dies 124. An example process of forming the vertical interconnect portion 128 is described in detail below.

The horizontally and vertically extending conductive elements of the first RDL 106, the second RDL 122, the vertical interconnects 126, and the vertical interconnect portion 128 may be connected to each other in various ways in order to form a plurality of signal paths through which signals, power, and ground may be communicated through the multi-die stack structure 100 and to/from connections points external the multi-die stack structure 100 (e.g., the solder bumps 112). The signal paths may be formed so that the signals, power, and ground may be communicated between two dies 114 of the die stack 102, between two fan-out dies 124, between a die 114 of the die stack 102 and a fan-out die 124, between a fan-out die 124 and a connection point external to the multi-die stack structure 100, such as a solder bump 112, and between a die 114 of the die stack 102 and a connection point external to the multi-die stack structure 100.

As a non-limiting example, a signal from an external source being sent to the first fan-out die 124(1) may be sent over a signal path of the substrate 106, through a solder bump 112 to the first fan-out die 124(1). As another non-limiting example, a signal sent from the first fan-out die 124(1) to an ith die 114(i) may be sent from the first fan-out die 124(1), through a signal path of the first RDL 106, through a vertical signal path of the vertical interconnect portion 128, to an I/O terminal of the ith dies 114(i). As another non-limiting example, a signal sent from the first fan-out die 124(1) to an ith die 114(i) may be sent from the first fan-out die 124, through the first vertical interconnect 126(1) extending though the first and second fan-out dies 124(1), 124(2), through a signal path of the second RDL 122, through a vertical signal path of the vertical interconnect portion 128, to an I/O terminal of the ith die 114(i). As another non-limiting example, a signal sent from the first fan-out die 124(1) that is first to be processed by the third fan-out die 124(3) before being sent to an ith die 114(i) may be sent to the third fan-out die 124(3) via the second vertical interconnect 126(2), where the signal may be processed by the third fan-out die 124(3). The signal may then be communicated though a signal path of the second RDL 122, through a vertical signal path of the vertical interconnect portion 128, to an I/O terminal of the ith die 114(i). As another example, a signal sent from an ith die 114(i) to the first fan-out die 124(1) may be sent from an I/O terminal of the ith die 114(i) to a vertical signal path of the vertical interconnect portion 128, to a signal path of the second RDL 122, through the fourth vertical interconnect 126(4), through a signal path of the first RDL 106, to an I/O terminal or connection point on an active surface of the first fan-out die 124. These example signal paths are non-limiting and are described to illustrate various ways that horizontally-extending and vertically-extending signal paths of the first RDL 106, the second RDL 122, the vertical interconnects 126, and the vertical interconnection portion 128 can be combined to communicate signals between the dies 114, the fan-out dies 124, and to/from connection points external to the multi-die stack structure, such as the solder bumps 112. Various other signal paths formed from any of various combinations of the first RDL 106, the second RDL 122, the vertical interconnects 126, and the vertical interconnection portion 128 may be possible.

Figure 5:
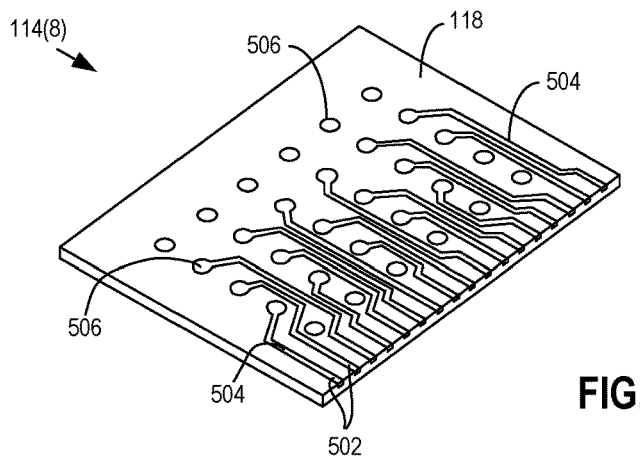
FIG. 5 is a perspective view of an example configuration of a planar surface of the die stack portion of FIGS. 1, 3, and 4 closest to a fan-out portion of the multi-die stack structure.

Also, as shown in FIG. 1, the bottom surface 118 of the die stack 102 may be coupled to and/or in contact with the second RDL 122. FIG. 5 shows an example configuration of the bottom surface 118 of the die 114(8) closest to the second RDL 122. For some example configurations, the bottom surface 118 may include its I/O terminals 502, and may also include metal traces connected to the I/O terminals 502 and horizontally extending inwardly away from the edge of the die 114(8). The bottom surface 118 may also include conductive connection points 506, which may be contact pads or termination points of through-silicon vias (TSVs) vertically extending through the die 114(8). As shown in FIG. 5, some of the conductive connection points 506 may be connected to the traces 504, and some may be isolated (i.e., not connected to any of the traces 504). For some example configurations, at least some of the conductive portions 506 may be connection points that are connected to signals paths of the second RDL 122. This way, signals may be directly communicated between the second RDL 122 and the die of the stack 102 that is closest to and/or in contact with the second RDL 122. In other example configurations, the die closest and/or in contact with may not directly communicate with the second RDL 122, and instead, signals communicated between the second RDL 122 and the last die 114(8) may be communicated through a vertical path of the vertical interconnect portion. For these other configurations, the last die 114(8) may be oriented and configured the same as the other dies 114 of the die stack 102, such as by having the configuration of the example die 200 shown in FIG. 2.

In addition, as previously described, the fan-out portion 104 may be disposed within a volume above or below defined and bounded by a vertical profile of the die stack 102. Accordingly, each of the fan-out dies 124 that are part of the fan-out portion 104 may have the same size as or may be smaller than the size of the dies 114 of the die stack 102. In particular, the surface areas of the planar surfaces of the each of the fan-out dies 124 may be the same as or smaller than the surface areas of the planar surfaces of the dies 114. For example, assuming that the horizontal dimension shown in FIG. 1 is the width, FIG. 1 shows the widths of the three fan-out dies 124(1), 124(2), 124(3) as each being smaller than the widths of the dies 114 (or the width of the die stack 102). However, the width of the first RDL 106 is shown as being equal or substantially equal to the larger width of the dies 114 as opposed to the smaller width of the first fan-out die 124(1). Further, the solder bumps 112 are shown as horizontally extending along the width of the first RDL 106. Assuming that at least some of connection points of the fan-out die 124 are connected to some of the solder bumps 112 via signals paths of the first RDL 106, particularly those solder bumps 112 horizontally extending beyond the first fan-out die 124(1), a fan-out structure is provided with respect to at least one horizontal dimension in that the connection points or I/O terminals located on the active surface of the first fan-out die 124(1) may "fan out" to a larger footprint of I/O terminals provided by the solder bumps 112. As previously described, the I/O terminals on the active surface of the first fan-out die 124(1) may connected to the solder bumps 112 through signals paths of the first RDL 106.

For some example configurations, at least two of the fan-out dies 124 of the fan-out portion 104 may be of different types or configured differently from each other. For example, the two different fan-out dies may have different circuit elements, a different configuration of circuit elements, be configured to perform different functions or operations, and/or serve a different purpose or function within the multi-die stack structure 100. As an example, for memory applications, one of the fan-out dies 124, such as the first fan-out die 124(1), may be a controller that is configured to control and/or manage various memory operations of the multi-die stack structure 100. For example, the controller die 124(1) may be configured to communicate with a host device external to the multi-die stack structure 100 via the first RDL 106, such as by receiving host commands (e.g., read and write commands), receiving from the host data to be programmed into the memory dies 114 for responding to a host write command, and sending to the host data stored in the memory dies 114 for responding to a read command. Additionally, the controller die 124(1) may be configured to perform certain media management functions such as determining where data is to be programmed into and/or stored in the memory dies 114, maintaining or managing one or more address data structures or tables that identifies where data is stored in the memory dies 114 and/or that maps physical addresses maintained by the memory device with logical addresses maintained by the host device. The controller die 124(1) may be configured to perform other memory management functions, such as wear leveling, folding, error detection and correction, suspend/resume, garbage collection, interleaving schemes, boot configurations, start-up and power cycle operations, and any other of various memory management and/or control operations that may not be performed on or with a memory die 114.

Another of the fan-out dies 124, such as the second fan-out die 124(2), may be configured to perform switching or routing functions. For example, suppose the controller die 124(1) wants to send a first data set to the first memory die 114(1) and a second data set to the third memory die 114(3). The controller die 124(1) may be configured to send both the first data set and the second data set to the routing fan-out die 124(2), and the circuit elements of the routing fan-out die 124(2) may be configured to route the first data set to the first memory die 114(1) and the second data set to the third memory die 114(3).

The third fan-out die 124(3) may similarly be configured as a routing die or alternatively, may be configured to perform a different function. For example, the third fan-out die 124(3) may be used for power management and supply power to the memory dies 114 and/or the other fan-out dies 124. For such a configuration, the third fan-out die 124(3) may include various analog circuitry such charge pumps and/or regulator circuitry configured to receive a power supply (e.g. a supply voltage) from an external source and generate one or more regulated voltages for various circuit components, such as a regulated voltage for a physical interface (PHY), a regulated voltage for delay-locked loop (DLL) circuitry, and/or a regulated voltage for phase-locked loop (PLL) circuitry, as non-limited examples. In addition or alternatively, the third fan-out die 124(3) may be configured with analog circuitry configured as calibration circuitry, such as process, voltage, temperature (PVT) detection and calibration circuitry. In addition or alternatively, the third fan-out die 124(3) may be configured with power-on detection circuitry configured to detect when the power from an external source begins being received and/or is no longer being received in order for the other fan-out dies 124 and/or the memory dies 114 to properly begin power up and power down operations. As another example, the third fan-out die 124(3) may include volatile memory, such as DRAM. Data to be programmed into the memory dies 114 that is received from an external host device and/or data that is read from the memory dies 114 and to be sent to the external host device may be temporarily stored in the volatile memory of the third fan-out die 124(3).

Other types of fan-out dies may be possible. By configuring the fan-out portion 104 with a plurality of fan-out dies 124, where at least two of the fan-out dies 124 may be of different types, the fan-out portion 104 may be referred to as a heterogeneous fan-out (HFO) portion or structure.

In addition, at least for non-volatile memory applications where the multi-die stacked structure 100 is a non-volatile memory system or device, the fan-out dies 124 may be considered accessory dies since they do not perform the main objective of the multi-die stacked structure 100, which is to store data in a non-volatile manner. That main objective is performed by the memory dies 114 that include the non-volatile memory cells. However, the accessory dies 124 are needed in the non-volatile memory system 100 in order for the memory dies 114 to be able to successfully perform the main objective and for the non-volatile memory system 100 as a whole to operate as desired. The accessory dies 124 that are part of the fan-out portion 104 may include all of the accessory dies that are needed for the non-volatile memory system 100 to successfully operate and perform all of the operations of the non-volatile memory system 100. FIG. 1 shows three accessory dies 124(1), 124(2), 124(3) for illustration purposes, although any number of accessory dies in various configurations may be disposed between the first and second RDL 106, 122 so that the fan-out portion 104 includes a complete set of accessory dies for the non-volatile memory system 100. In turn, the combination of the memory dies 104 of the die stack 102 and the accessory dies 124 of fan-out portion 104 may provide a complete set of dies of the non-volatile memory system 100 integrated as a single package. The die stack 102 and the fan-out portion 104 integrated as a single package is further illustrated in FIG. 1 with an outer encapsulation or protective layer or coating 132, which may be made of an epoxy resin, an ink-based material, or other similar moldable composition, that vertically extends over side surfaces formed by the die stack 102, the fan-out portion 104, and the vertical interconnect portion 128. Although not shown, the outer, protective coating 132 may also horizontally extend over the top surface 116 of the die stack 114.

Also, by configuring the fan-out portion 104 within a volume defined and bounded by the vertical profile of the multi-die stack structure 100, the overall horizontal dimensions of the multi-die stack structure 100 may not exceed the horizontal dimensions required or determined by the die stack 102. For non-volatile memory applications where the multi-die stacked structure 100 is a non-volatile memory system or device, the planar surface area or horizontal dimensions of the non-volatile memory dies 114 may exclusively (i.e., not in combination with other packages housing accessory dies and/or substrates on which multiple packages are mounted) determine the overall horizontal dimensions of the multi-die stack non-volatile memory system 100. Additionally, because the signals paths do not include wire bonds, increased die capacitance through parallel connections formed by wire bonding may be avoided, which in turn may allow for increased numbers of dies 114 in the stack 102 without concern of a degradation in performance, such as due to increased noise, power loss, and signal degradation. Also, by using horizontally and vertically-oriented signal paths without wire bonding, the stacked dies 114 may be vertically aligned relative to each other to form a generally cuboid structure, as previously described. In contrast, where wire bonding is used, the stacked dies may be in the form of a staircase structure, or generally a parallelepiped structure, in order to provide contact areas on each of the dies for the wire bonding. Such a parellelpiped or staircase structure may provide increased overall horizontal dimensions or an increased vertical profile compared to its cuboid counterpart. Further, as previously described, the multi-die stack structure 100 of FIG. 1 does not include any substrates (i.e., there are no substrates in between the top surface 116 and a bottom surface of the base RDL 106 in contact with the solder bumps 112. Such a lack of substrates may serve to reduce an overall height or vertical dimension of the multi-die stack structure 100 compared to other non-volatile memory devices with the same storage capacity. Thus, at least with respect to non-volatile memory applications, the overall horizontal and vertical dimensions of the combined die stack and fan-out structure 100 may be less, even substantially less, compared to other non-volatile memory system with the same storage capacity, including other non-volatile memory systems that use wire bonding, separate a total number of dies into separate die stacks due to wire bonding constraints, include one or more substrates, package accessory dies in separate packages, or some combination thereof.

Other benefits or advantages may be experienced through the combined die stack and fan-out structure 100 of FIG. 1, including increased data rate or bandwidth, such as a rate increased from the Megahertz (MHz) range to the Gigahertz (GHz) range or higher (e.g., >1 GHz); improved thermal (e.g., heat dissipation) functionality; and enhanced yield as examples.

Figure 6:
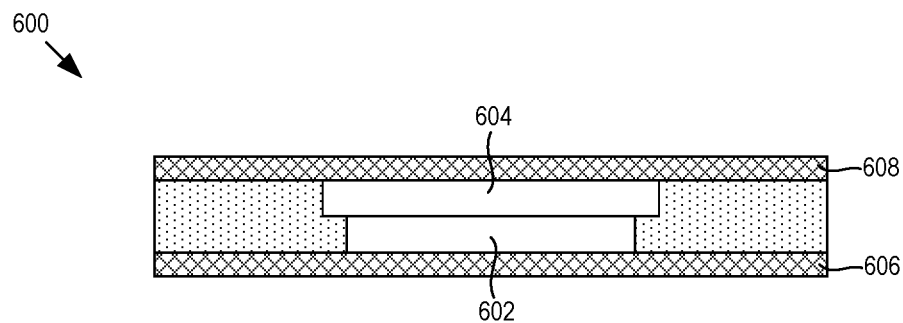
FIG. 6 is a cross-sectional side view of a second example configuration of a fan-out structure.
Figure 7:
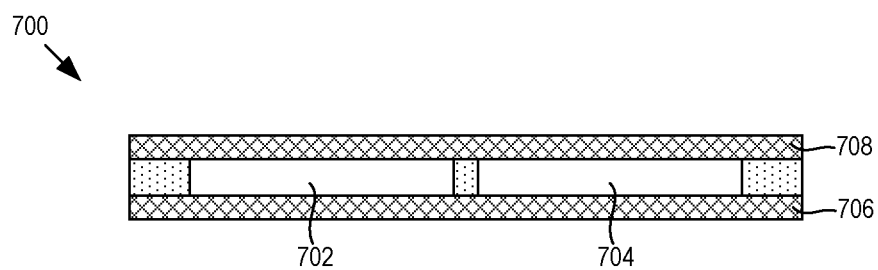
FIG. 7 is a cross-sectional side view of third example configuration of a fan-out structure.
Figure 8:
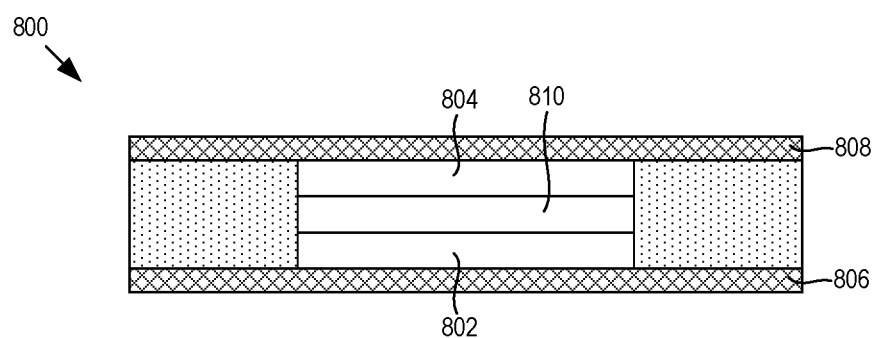
FIG. 8 is a cross-sectional side view of a fourth example configuration of a fan-out structure.

As previously described, the fan-out dies 124 may include any of various numbers and/or be configured in various ways between the first RDL 106 and the second RDL 122. FIGS. 6-8 show various example configurations of a fan-out structure that may be used instead of the configuration for the fan-out portion 104 shown in FIG. 1, or at least illustrate other ways, either alone or in combination, that the fan-out dies can be configured relative to each other in between the first and second redistribution layers. As described below, each of the fan-out structures in FIGS. 6-8 may include a plurality of fan-out dies. For some example configurations in each of the embodiments in FIGS. 6-8, at least two of the fan-out dies may be of different types, such that the fan-out die structures in each of FIGS. 6-8 may be configured as a heterogeneous fan-out (HFO) structure.

Referring particularly to FIG. 6, an example fan-out structure 600 may include a first fan-out die 602 and a second fan-out die 604 disposed in between a first RDL 606 and a second RDL 608. The first fan-out die 602 may include an active surface that faces and/or is in contact with the first RDL 606, and the second fan-out die 604 may include an active surface that faces and/or is in contact with the second RDL 608. As shown in FIG. 6, the second fan-out die 604 may be stacked on top of the first fan-out die 602 (or vice versa) in a back-to-back orientation in that their respective non-active surfaces face and/or are in contact with each other. Also, although not shown, one or more vertical interconnects may vertically extend between the first and second RDLs 606, 608 by extending through the first and second fan-out dies 602, 604, around (or outside of) the first and second fan-out dies 602, 604, or a combination thereof.

FIG. 7 shows another example fan-out structure 700 that includes a first fan-out die 702 and a second fan-out die 704 disposed in between a first RDL 706 and a second RDL 708. In contrast to the stacked configuration shown in FIG. 6, the first and second fan-out dies 702, 704 may be generally oriented or disposed in a same or common plane. Accordingly, first planar surfaces for each of the first and second fan-out dies 702, 704 may be in contact with the first RDL 706, and opposing second planar surfaces for each of the first and second fan-out dies 702, 704 may be in contact with the second RDL 708. The two fan-out dies 702, 704 may be vertically oriented relative to each other in various ways. For example, the active surfaces of the two fan-out dies 702, 704 may face in the same vertical direction such that they are both in contact with the first RDL 706 or both in contact with the second RDL 708. Alternatively the active surfaces of the two fan-out dies 702, 704 may face in opposite vertical directions such that one of the fan-out dies 702, 704 is in contact with the first RDL 706 and the other of the fan-out dies 702, 704 is in contact with the second RDL 708. Also, although not shown, one or more vertical interconnects may vertically extend between the first and second RDLs 706, 708 by extending through the first fan out die 702, through the second fan-out die 704, around (or outside of) the first and second fan-out dies 702, 704, or a combination thereof.

FIG. 8 shows another example fan-out structure 800 that includes a first fan-out die 802, a second fan-out die 804, and a third fan-out die 810 disposed in between a first RDL 806 and a second RDL 808. The first, second, and third fan-out dies 802, 804, 810 may be configured in a stacked configuration, where the third fan-out die 810 is disposed in between the first and second fan-out dies 802, 804. Also, like the configurations shown in FIGS. 1 and 6, an active surface of the first fan-out die 802 may be in contact with the first RDL 806 and/or an active surface of the second fan-out die 804 may be in contact with the second RDL 808. Also, although not shown, one or more vertical interconnects may vertically extend between the first and second RDLs 806, 808 by extending through the first, second, and third fan-out dies 802, 804, 810, around (or outside of) the first, second, and third fan-out dies 802, 804, 810, or a combination thereof.

In addition, the fan-out structures 104, 600, 700, and 800 of FIGS. 1, 6, 7, and 8 are shown and described as being coupled to and/or used in conjunction with a stack of dies, such as the die stack 102 of FIG. 1. In other example embodiments, the fan-out structure, including those example embodiments where the fan-out structure is a heterogeneous fan-out structure, may be a standalone device or may be coupled to a component other than a die stack. For example, the fan-out structure may be coupled to a single die, or a plurality dies configured in a way other than a stack. The plurality of dies, whether configured in a stacked configuration or in an unstacked configuration, may have a vertical profile defining a volume in which the fan-out structure is disposed. Also, other example embodiments may include multiple fan-out structures. For example, with reference to FIG. 1, other example embodiments may include a second fan-out portion coupled to the top surface 116 of the die stack 102, a second fan-out portion coupled below the first fan-out portion 104, or a combination thereof. As another example, a third RDL (or more) may be included in parallel with the first and second RDLs 106, 122 to create a plurality of regions in which fan-out dies may be disposed. The vertical interconnect portion 128 may vertically extend along a side surface or wall of such structures, similar to that shown in FIG. 1. Various embodiments that use one or more fan-out structures, including one or more heterogeneous fan-out structures, in combination with one or more dies or other types of integrated circuits or chips, that can communicate with each other through a network of horizontally and vertically extending RDLs or other types of signal paths or traces, may be possible.

FIGS. 9A-9F illustrate an example method of manufacturing a fan-out structure that can be implemented in combination with a die stack, as illustrated in FIG. 1. The fan-out structure shown being manufactured in FIGS. 9A-9F is the fan-out structure 600 of FIG. 6, although the method may be used in a similar manner to manufacture other similar fan-out structures.

Figure 9A:
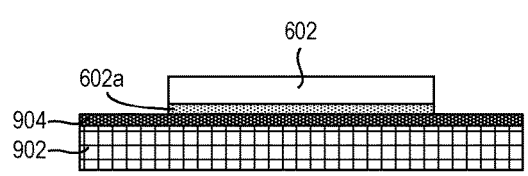
FIG. 9A is a cross-sectional side view of a first fan-out die of a fan-out structure placed on a support structure.

Referring to FIG. 9A, the first fan-out die 602 may be placed, such as by using a pick-and-place machine, onto a predetermined area of a first support structure that includes a carrier or plate 902 of sufficient stability, rigidity, and or strength and a carrier tape 904 covering a surface of the carrier 902. The pick-and-place machine may place the first fan-out die onto the support structure such that an active surface 602a of the first fan-out die 602 faces and is in contact with the carrier tape 904. The carrier tape 904 may be of a suitable material that protects the first fan-out die 602 from damage, such as physical and/or electro-static discharge (ESD) damage.

Figure 9B:
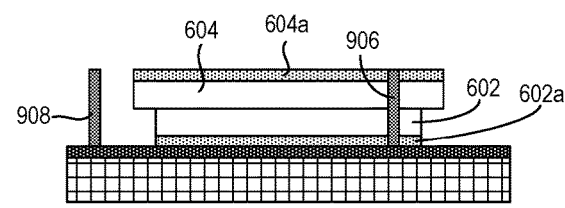
FIG. 9B is a cross-sectional side view of a second fan-out die placed on the first fan-out die of FIG. 9A and vertical interconnects formed through and around the first and second fan-out dies.

Referring to FIG. 9B, the second fan-out die 604 may be placed, such as by using the pick-and-place machine, onto the first fan-out die 602 such that the first and second fan-out dies 602, 604 are in a stacked configuration or orientation. Two or more dies may be oriented parallel relative to each other when placed with the pick-and-place machine. As shown in FIG. 9B, an active surface 604a of the second fan-out die 604 may face in the opposite direction as the active surface 602a of the first fan-out die 602. That is, the first and second fan-out dies 602, 604 may form a back-to-back stacked configuration, where the non-active surface of the second fan-out die 604 is mounted or stacked into the non-active surface of the first fan-out die 602. Although not shown, in some example methods, an epoxy or other adhesive layer may be disposed in between the two in-active surfaces to increase or enhance an adhesiveness between the first and second fan-out dies 602, 604 during the stacking portion of the method.

Also, as shown in FIG. 9B, vertical interconnects may be formed, including a first vertical interconnect 906 extending through the first and second fan-out dies 602, 604, and a second vertical interconnect 908 extending outside of or around the first and second fan-out dies 602, 604. The first and second vertical interconnects 906, 908 may be formed in various ways. For example, the first vertical interconnect 906 extending through the first and second fan-out dies 602, 604 may be in the form of a through-silicon via (TSV) or other similar conductive structure. In some example methods, respective portions of the TSV 906 may be pre-formed in each of the fan-out dies 602, 604, and the TSV 906 as a whole may form when the second fan-out die 604 is mounted on the first fan-out die 602 and the two portions are aligned and electrically connected together to form the TSV 906. In other example configurations, the portions of the TSV 906 may not be pre-formed, and the TSV 906 may be formed in its entirety upon the second fan-out die 604 being placed on the first fan-out die 602. The TSV 906 may be formed in various ways, such as by etching (e.g., a deep reactive ion etching process) followed by an electroplating or electroless process to make the via conductive. Other ways may be possible. In addition, the second vertical interconnect 908, which may be in the form of a conductive pillar or post, may also be formed in various ways. For example, a photoresist layer may be added around the first and second fan-out dies 602, 604, and an etching process may be used to remove portions of the photoresist. A plating process may then be used to fill in a conductive material in the removed portion of the photoresist to form the conductive pillar or post 908. The remaining photoresist material may then be removed. In other example methods, the photoresist material may not be used, and the conductive pillar or post 908 may be mechanically placed into the fan-out structure 600. Various other ways to form the vertical interconnects 906, 908 may be possible.

Figure 9C:
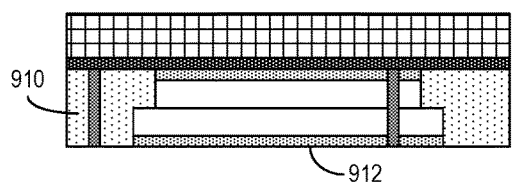
FIG. 9C is a cross-sectional side view of the components shown in FIG. 9B encapsulated with an encapsulation material.

Referring to FIG. 9C, after the fan-out dies 602, 604 are placed and the vertical interconnects 906, 908 are formed, an encapsulation process may be performed during which an encapsulation material 910, such as an epoxy, is filled around the fan-out dies 602, 604 and the vertical interconnects 906, 908 to protect, secure, and seal these components relative to each other. For some example methods, the portion of the fan-out structure manufactured up to the point shown in FIG. 9B may be flipped (e.g., flipped upside down) and placed in a container that defines an outer boundary for the encapsulation material 910.

Figure 9D:
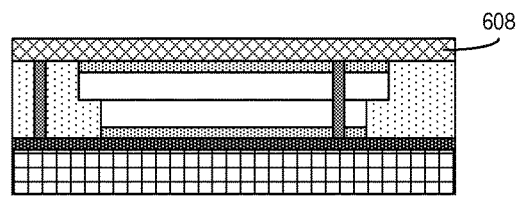
FIG. 9D is a cross-sectional side view of the encapsulated components shown in FIG. 9C, further with a redistribution layer formed over a surface defined by a planar surface of the second fan-out die.

Referring to FIG. 9D, after the fan-out dies 602, 604 are encapsulated, the second RDL 608 may be formed over an outer surface 912 (FIG. 9C) that includes the active surface 604a of the second fan-out die 604 and surrounding encapsulation material. The second RDL 608 may be formed in various ways, such through a photolithography process, for example. Also, for example methods where the fan-out structure was flipped to perform the encapsulation process then the fan-out structure may be flipped again in order to perform the photolithography process and form the second RDL 608. This multi-flipping is shown in FIGS. 9C and 9D.

Figure 9E:
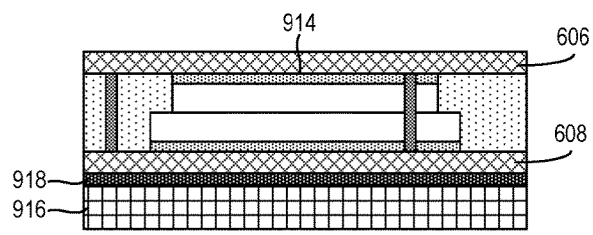
FIG. 9E is a cross-sectional side view of the components shown in FIG. 9D, further with a redistribution layer formed over a surface defined by a planar surface of the first fan-out die.
Figure 9F:
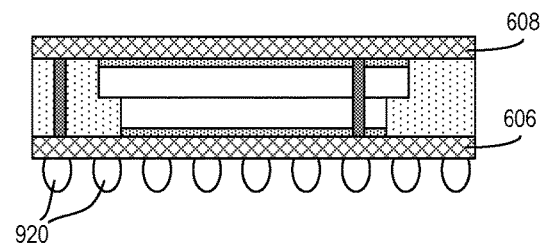
FIG. 9F is a cross-sectional side view of the components of FIG. 9E, further with solder bumps formed on the redistribution layer formed over the surface defined by the planar surface of the first fan-out die.

After the second RDL 608 is formed, the first RDL 606 may be formed. Referring to FIG. 9E, the first support structure including the carrier 902 and the carrier tape 904 may be removed from the fan-out structure at the point of manufacture shown in FIG. 9D so that an outer surface 914 that includes the active surface 902a and surrounding encapsulation material is exposed. The first RDL 606 may then be formed on the surface 914, such as by using a photolithography process, for example. Also, in some example methods as shown in FIG. 9E, before removing the first support structure and/or forming the first RDL 606, the fan-out structure may be mounted on a second support structure that includes a second carrier 916 with a second carrier tape 918 covered on the surface of the second carrier 916. The second RDL 908 may be positioned on the second carrier tape 918. Also, as shown in FIG. 9E, the fan-out structure may be flipped again (e.g., a third time) in order to mount the fan-out structure onto the second support structure and so that the first RDL 606 may be formed on the surface 914. Referring to FIG. 9F, solder bumps 920 may be formed onto the first RDL 606 for bonding the fan-out structure to the substrate 108 (FIG. 1). Various processes may be used to form the solder bumps, such as ultrasonic soldering, solder screen-printing, ball mounting, or any other of various techniques.

Referring back to FIG. 1, after the fan-out structure 104 is made, it may be coupled to the die stack 102 to form the multi-die stack structure 100. In particular, the second RDL 122 may be coupled to the bottom surface 118 of the die stack 102. An adhesive, such as an epoxy may be used to enhance the coupling. Upon being coupled, the side surface 120 where the I/O terminals of the dies 114 are aligned and the side surface 130 of the fan-out portion may form a substantially flat side surface or side wall on and/or over which the vertical interconnect portion 128 may be formed.

FIGS. 10A-10J show an example method of forming the vertical interconnect portion 128. To show components of the vertical interconnect portion being formed in detail, FIG. 10A-10J show in isolation a portion of the cross-sectional view of FIG. 1 where the vertical interconnect is formed, which is taken along line 10-10 in FIG. 1. FIGS. 10A-10J show I/O terminals 1002 disposed on each of the dies 114(1)-114(8). In addition, for simplicity, FIGS. 10A-10F show the first RDL 106 and the second RDL 122 as each including a respective single signal path 1004, 1006, to which a respective vertical path of the vertical interconnect portion 128 is connected. Other signal path configurations of the first RDL 106 and/or the second RDL 122 for connecting to vertical paths of the vertical interconnect portion 128 may be possible.

In addition, FIGS. 10A-10J show adjacent dies 114(1)-114(8) being separated by an adhesive material 1008, such as an organic epoxy or other similar material, that enhances the adhesiveness between a bottom surface and a top surface of adjacent dies 114(1)-114(8). An adhesive layer 1008 is also shown disposed in between the bottom surface 118 of the last die 114(8) and the second RDL 122 to enhance the coupling between the die stack 102 and the fan-out portion 104.

As mentioned, when the die stack 102 and the fan-out portion 104 are coupled or combined together, a flat side surface or side wall 1010 that is the combination of the side surface 120 of the die stack 102 to which the I/O terminals 1002 are aligned and/or extend, and the side surface 130 of the fan-out portion 104. The vertical interconnect portion 128 is formed on the side surface or side wall 1010.

Figure 10A:
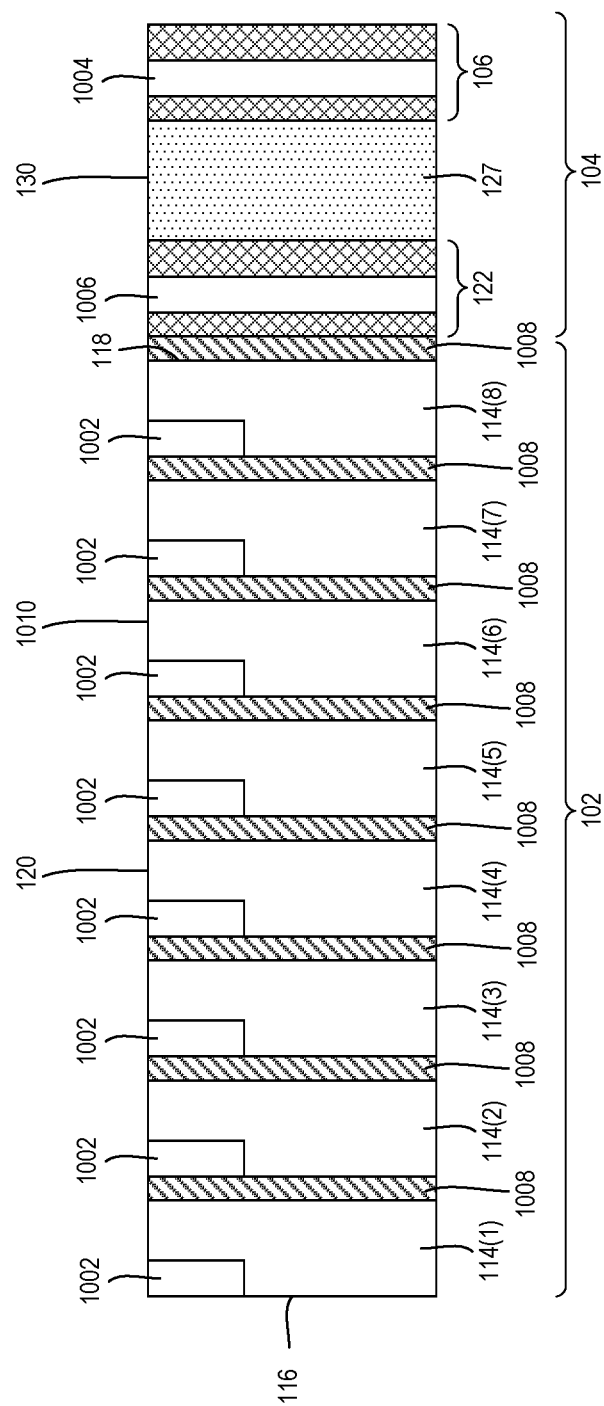
FIG. 10A is a cross-sectional side view of a portion of the multi-die stack structure of FIG. 1, shown in isolation, where a vertical interconnect portion is to be formed.
Figure 10B:
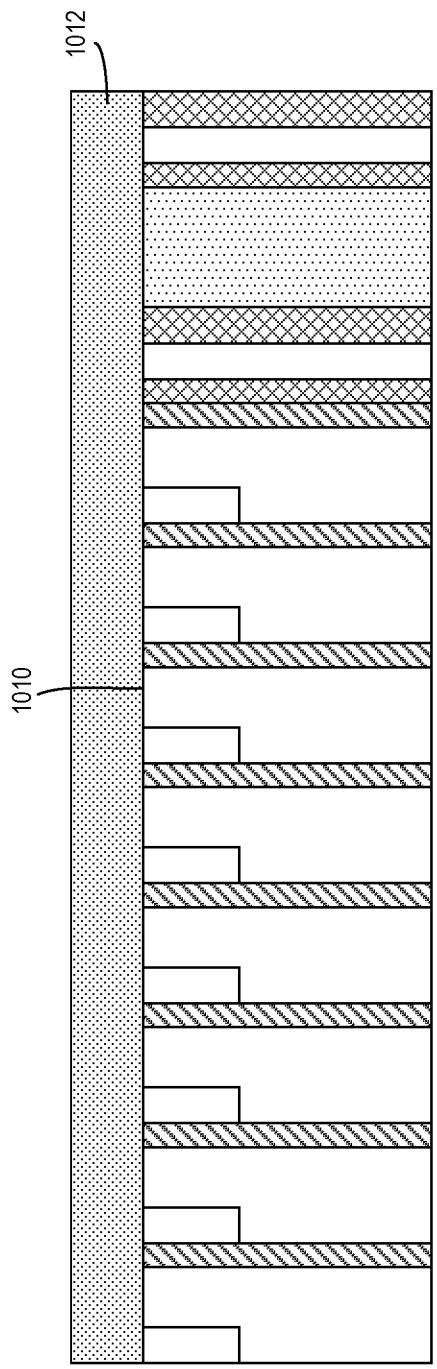
FIG. 10B is a cross-sectional side view of the portion of FIG. 10A, further with a polymer coating applied over a side wall where the vertical interconnect portion is formed.
Figure 10C:
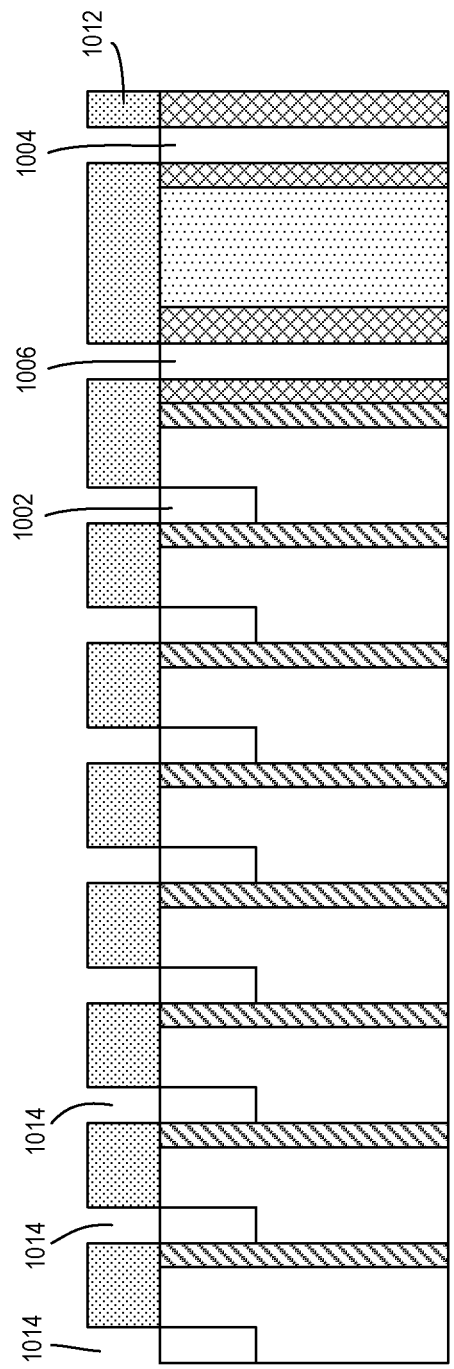
FIG. 10C is a cross-sectional side view of the portion of FIG. 10B, further with portions of the polymer coating having been removed to expose input/output (I/O) terminals and signal paths to be connected to traces of the vertical interconnect structure.

Referring to FIG. 10B, the method may begin by applying a polymer coating 1012, such as polybenzoaxazole (PBO) for example, over the side surface 1010. The polymer coating 1012 may be applied with a spray coater, for example. Referring to FIG. 10C, portions 1014 of the polymer coating 1012 may be removed, such as through a lithography process, to expose the underlying conductive portions (i.e., the I/O terminals 1012 and the signal paths 1004, 1006) to which the vertical interconnects of the vertical interconnect portion 128 are to be connected.

Figure 10D:
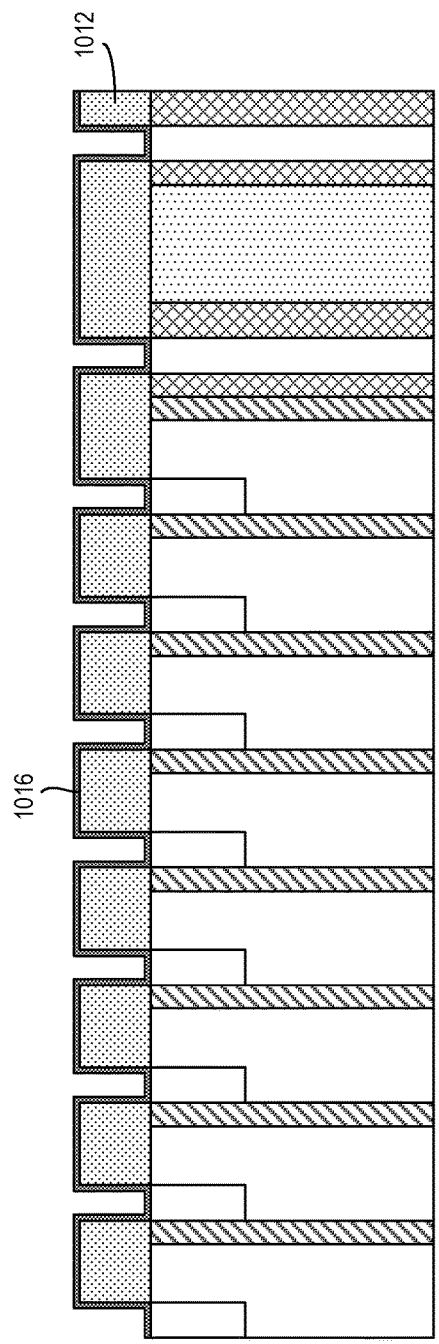
FIG. 10D is a cross-sectional side view of the portion of FIG. 10C, further with a seed layer disposed over the remaining polymer coating and exposed I/O terminals and signal paths.
Figure 10E:
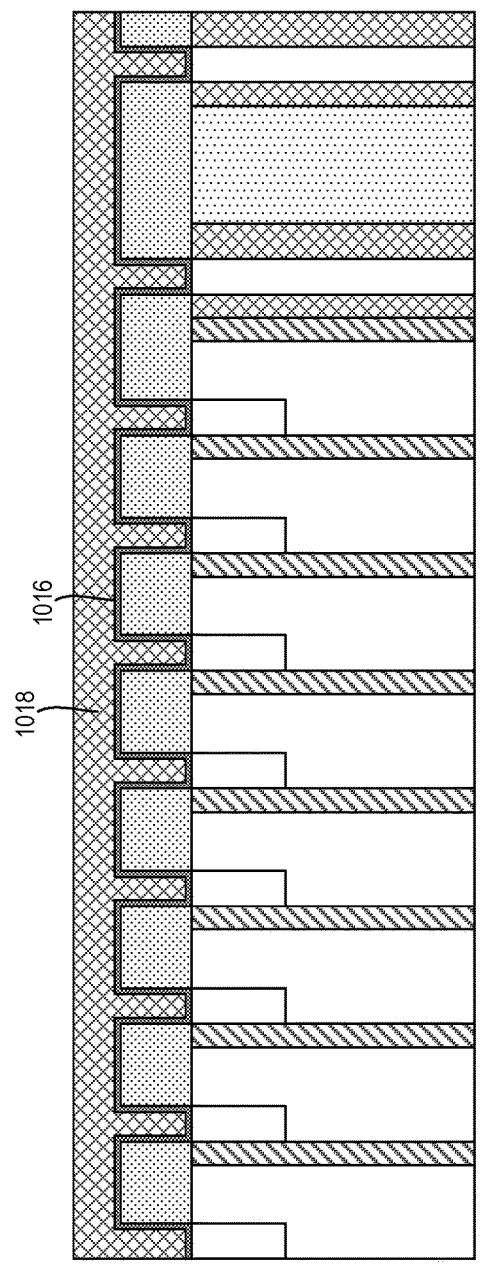
FIG. 10E is a cross-sectional side view of the portion of FIG. 10D, further with a metal layer disposed over the seed layer.

Referring to FIG. 10D, a conductive seed layer 1016, such as titanium, may be formed over the remaining portions of the polymer layer 1012, which may enhance the adhesiveness of a metal layer to be next applied over the polymer coating 1012 and exposed I/O terminals 1002 and signal paths 1004, 1006. The conductive seed layer 1016 may be applied through a sputtering process, for example. Referring to FIG. 10E, a metal layer 1018 used for the vertical paths, traces, or interconnects of the vertical interconnect portion 128 may be formed over the conductive seed layer 1016. An example material for the metal layer 1018 may be copper, although other conductive materials may be used. Also, the metal layer 1018 may be formed over the conductive seed layer 1016 using a physical vapor deposition (PVD) process, although other processes may be possible.

Figure 10F:
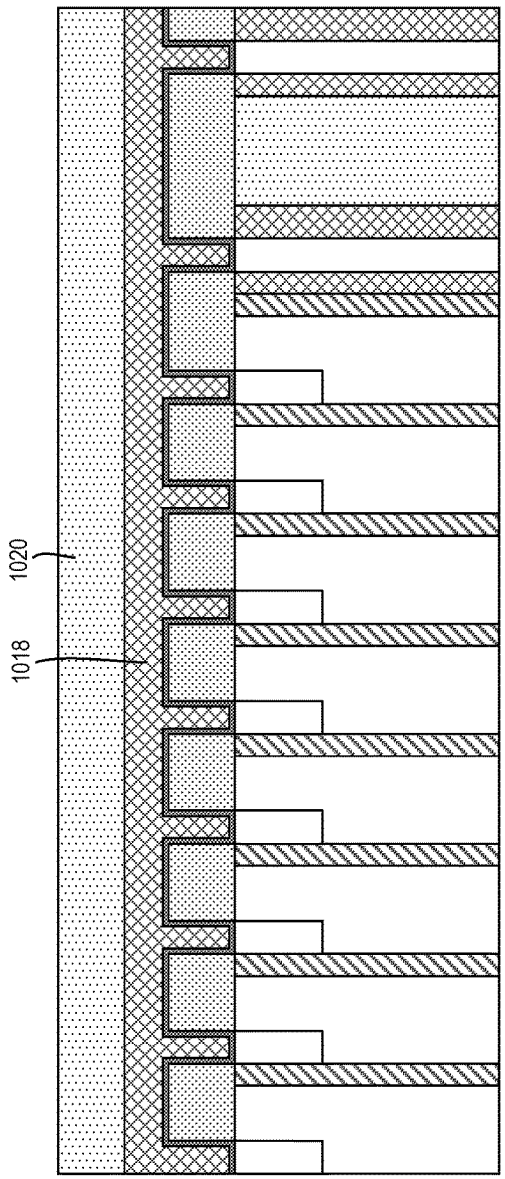
FIG. 10F is a cross-sectional side view of the portion of FIG. 10E, further with a photoresist layer disposed over the metal layer.
Figure 10G:
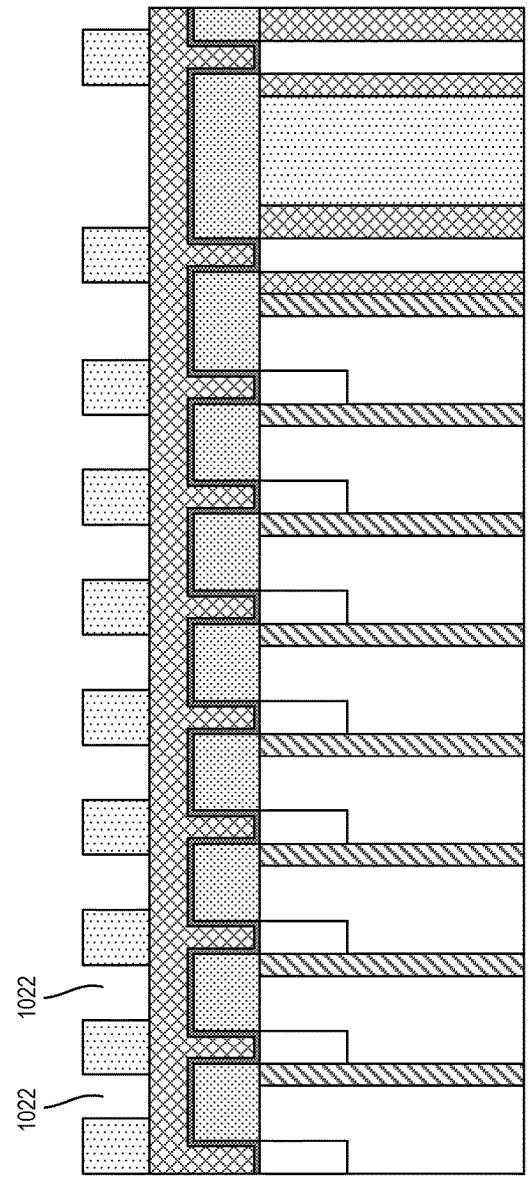
FIG. 10G is a cross-sectional side view of the portion of FIG. 10F, further with portions of the photoresist layer removed to expose portions of the metal layer.
Figure 10H:
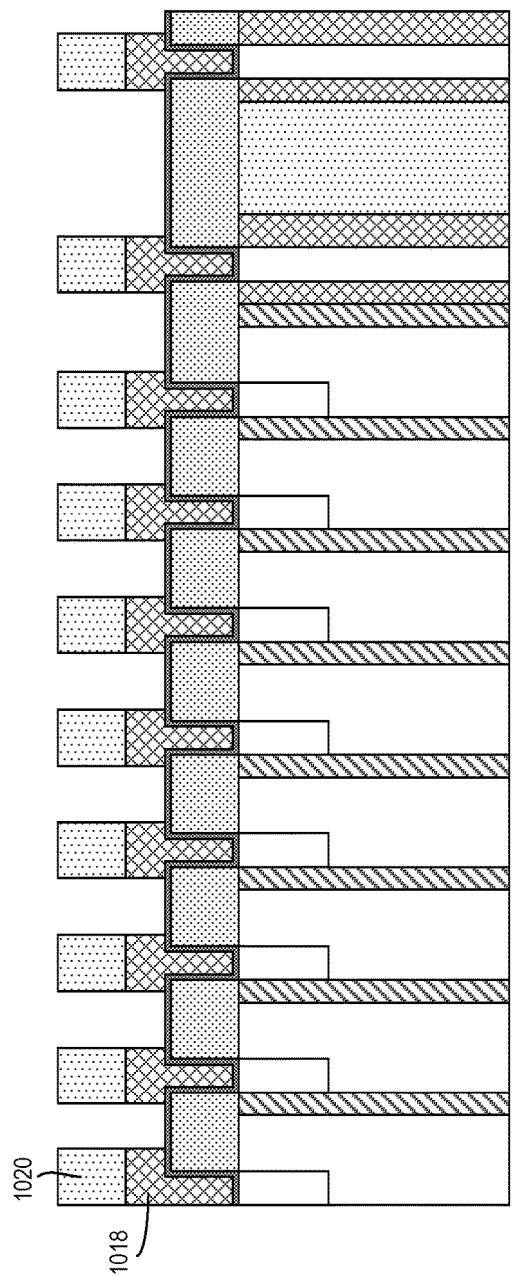
FIG. 10H is a cross-sectional side view of the portion of FIG. 10G, further with portions of the metal layer removed to form the vertical traces of the vertical interconnect structure.
Figure 10I:
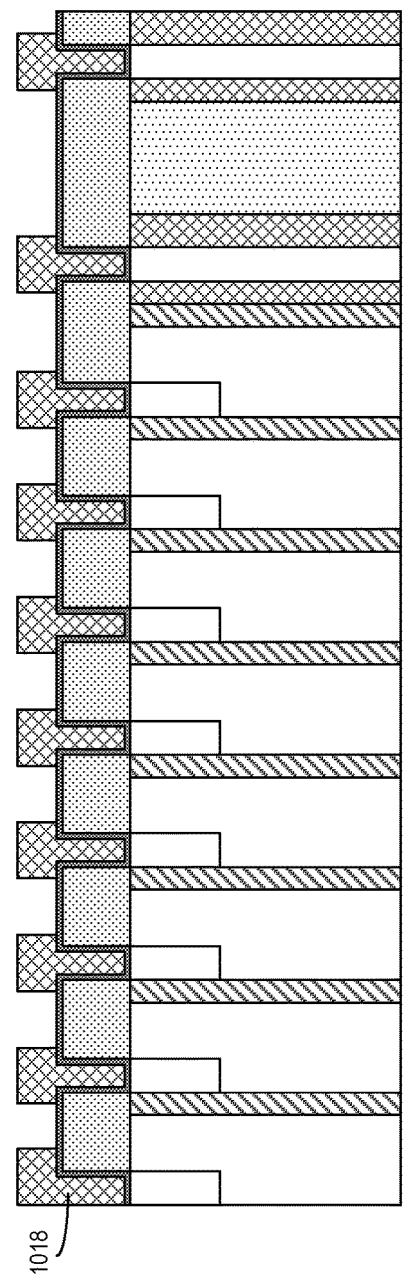
FIG. 10I is a cross-sectional side view of the portion of FIG. 10H, further with the remaining portions of the photoresist layer having been removed.
Figure 10J:
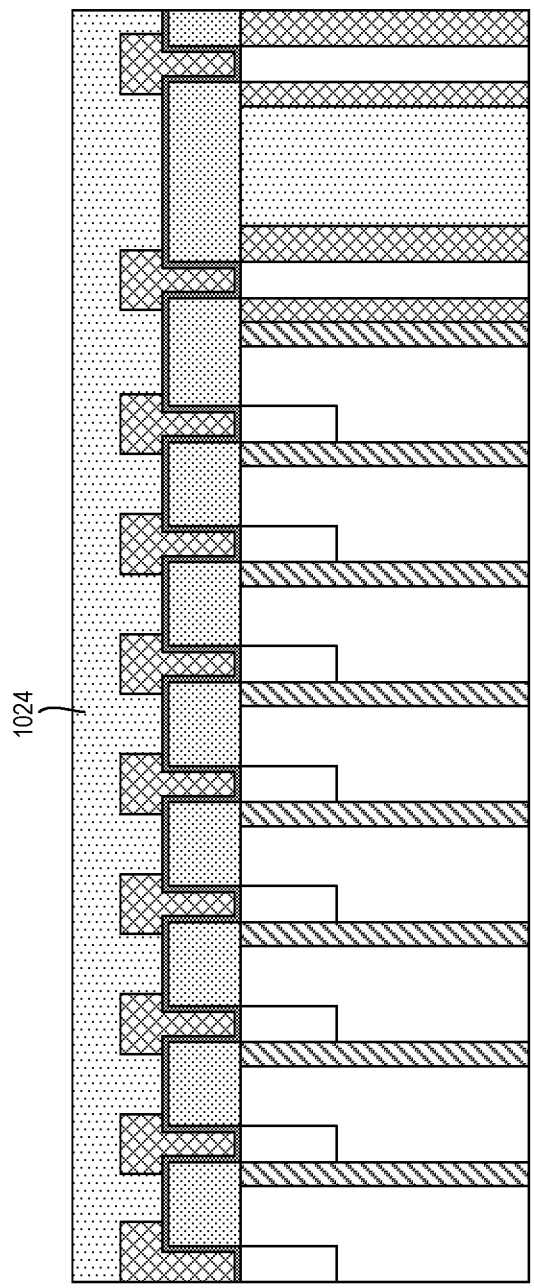
FIG. 10J is a cross-sectional side view of the portion of FIG. 10I, further with a protective layer disposed over the remaining portions of the metal layer and exposed seed layer portions.

Referring to FIG. 10F, a photoresist (PR) layer 1020 may be formed over the metal layer 1018. Referring to FIG. 10G, portions 1022 of the photoresist layer 1020 may be removed, such as through a photolithography process, to expose certain portions of the metal layer 1018 that are then to be removed. Referring to FIG. 10H, the exposed portions of the metal layer 1018 may be removed, such as through a wet etching process and/or an ion beam etching (IBE) process. Referring to FIG. 10I, the remaining portions of the photoresist layer 1020 may be removed to expose the remaining metal portions of the metal layer 1018. The remaining portions of the metal layer 1018 may form the vertical traces, paths, or interconnects of the vertical interconnect portion 128. Referring to FIG. 10J, a final step may be to add an outer protective layer or coating 1024, such as an epoxy resin, ink-based coating, or polymer-based coating (e.g., PBO) or other similar material, over the traces 1018 and the exposed portions of the seed layer 1016. For some example methods, the outer coating 1024 may be a portion of the outer coating 132 of the multi-die stack structure 100 shown in FIG. 1 that integrates the various components of the multi-die stack structure 100 as a single package. Alternatively, formation of the outer coating 132 may be an additional step. For example, the protective layer or coating 1024 may be added to finally form the vertical interconnect portion 128, as shown in FIG. 10J. Subsequently, an additional step may be performed in which the outer coating 132 to the multi-die stack structure 100 is applied to encapsulate and protect the components of the multi-die stack structure 100 as a whole.

It is intended that the foregoing detailed description be understood as an illustration of selected forms that the invention can take and not as a definition of the invention. It is only the following claims, including all equivalents, that are intended to define the scope of the claimed invention.

Finally, it should be noted that any aspect of any of the embodiments described herein can be used alone or in combination with one another.

We claim:

1. A device comprising:
   a cuboid die stack comprising a plurality of memory dies; and
   a fan-out structure disposed in a volume defined by a vertical profile of the cuboid die stack, wherein the fan-out structure comprises:
      a plurality of fan-out dies disposed in between a first horizontal redistribution layer and a second horizontal redistribution layer, the plurality of fan-out dies comprising:
         a first die configured as a controller for the plurality of memory dies; and
         a second die configured to route signals between the controller and the plurality of memory dies,
         wherein the first die comprises a first active surface and the second die comprises a second active surface, the first active surface and the second active surface facing in opposite directions, and
         wherein the first active surface contacts a first horizontal signal path and the second active surface contacts a second horizontal signal path,
   a device side surface comprising adjacent side surfaces of the cuboid stack and the fan-out structure;
   a vertical interconnect portion extending over the device side surface, wherein signal paths of the first redistribution layer and the second redistribution layer each horizontally extend and electrically connect to vertical signal paths of the vertical interconnect portion,
   wherein the first die and the second die are configured to communicate with the memory dies of the cuboid die stack by way of the first redistribution layer, the second redistribution layer, and the vertical interconnect portion.

2. The device of claim 1, wherein each of the first die and the second die comprise a planar surface area that is smaller than a planar surface area of plurality of memory dies of the die stack.

3. The device of claim 1, wherein no substrate is disposed in between the die stack and the fan-out structure.

4. The device of claim 1, wherein the die stack and the fan-out structure are encapsulated in a single package.

5. A device comprising:
   a cuboid stack of a plurality of memory dies, the cuboid stack having a vertical profile;
   a plurality of accessory dies comprising:
      a first die disposed within the vertical profile, the first die configured to receive host data from an external host device and control storage of the host data in the plurality of memory dies; and
      a second die oriented parallel with the first die and disposed within the vertical profile, the second die configured to route the host data to the plurality of memory dies;
   a first horizontal redistribution layer and a second horizontal redistribution layer extending parallel with the first die and the second die, the plurality of accessory dies disposed in between the first and second redistribution layers;
   a device side surface defined by the vertical profile of the cuboid stack, the device side surface comprising a side surface of the cuboid stack; and
   a vertical interconnect portion extending over the device side surface and perpendicular to the parallel orientation of the first and second dies, wherein signal paths of the first redistribution layer and the second redistribution layer each horizontally extend and electrically connect to vertical signal paths of the vertical interconnect portion,
   wherein the plurality of accessory dies is configured to communicate with the plurality of memory dies via signal paths of the first horizontal redistribution layer, signal paths of the second horizontal redistribution layer, and signal paths of the vertical interconnect portion,
   wherein the first die comprises a first active surface and the second die comprises a second active surface, the first active surface and the second active surface facing in opposite directions, and
   wherein the first active surface contacts the first horizontal redistribution layer and the second active surface contacts the second horizontal redistribution layer.

6. The device of claim 5, wherein the plurality of accessory dies further comprises a third die oriented parallel with the first die and the second die and disposed within the vertical profile.

7. The device of claim 5, wherein no substrate is disposed in between the cuboid stack and the plurality of accessory dies.

8. The device of claim 5, wherein cuboid stack, the first die, the second die, the horizontal signal path and the vertical signal path are encapsulated within a single package.

9. A device comprising:
   a cuboid stack of a plurality of memory dies;
   a first redistribution layer;
   a second redistribution layer; and
   a first integrated circuit and a second integrated circuit disposed in between the first redistribution layer and the second redistribution layer and disposed within a vertical profile of the cuboid stack,
   a device side surface defined by the vertical profile and comprising a side surface of the cuboid stack;
   a vertical interconnect portion perpendicular to the first and second redistribution layers and extending over the device side surface, wherein signal paths of the first and second redistribution layers horizontally extend and electrically connect to vertical signal paths of the vertical interconnect portion,
   wherein an active surface of the first integrated circuit is in contact with the first redistribution layer,
   wherein an active surface of the second integrated circuit is in contact with the second redistribution layer,
   wherein the first integrated circuit is configured to receive host read and write commands from an external host device, and wherein the second integrated circuit is configured to perform routing operations to communicate data in between the first integrated circuit and the plurality of memory dies, and
   wherein the first integrated circuit and the second integrated circuit are configured to communicate with the memory dies of the cuboid stack by way of the first redistribution layer, the second redistribution layer, and the vertical interconnect portion.

10. The device of claim 9, wherein the first redistribution layer is in contact with a planar surface of the cuboid stack.

* * * * *